US008887663B2

(12) United States Patent
Stebbins et al.

(10) Patent No.: US 8,887,663 B2
(45) Date of Patent: Nov. 18, 2014

(54) METHOD AND APPARATUS FOR FABRICATION OF CARBON NANOTUBES USING AN ELECTROSTATICALLY CHARGED SUBSTRATE AND LINER

(75) Inventors: Robert Stebbins, Round Rock, TX (US); Russell Olson, Austin, TX (US)

(73) Assignees: Samsung Austin Semiconductor, L.P., Austin, TX (US); Samsung Electronics Co., Ltd., Suwon-Si (KR)

( * ) Notice: Subject to any disclaimer, the term of this patent is extended or adjusted under 35 U.S.C. 154(b) by 252 days.

(21) Appl. No.: 13/246,788

(22) Filed: Sep. 27, 2011

(65) Prior Publication Data

US 2013/0078178 A1   Mar. 28, 2013

(51) Int. Cl.
| | | |
|---|---|---|
| *B05B 5/053* | (2006.01) |
| *D01F 9/127* | (2006.01) |
| *B82Y 40/00* | (2011.01) |
| *H01L 29/41* | (2006.01) |
| *C01B 31/02* | (2006.01) |
| *H01L 23/00* | (2006.01) |
| *B01J 19/08* | (2006.01) |
| *B82Y 30/00* | (2011.01) |
| *D01F 9/12* | (2006.01) |
| *H01L 29/06* | (2006.01) |

(52) U.S. Cl.
CPC ............ *B01J 19/08* (2013.01); *H01L 29/0676* (2013.01); *H01L 29/0673* (2013.01); *B82Y 40/00* (2013.01); *H01L 29/413* (2013.01); *C01B 31/0226* (2013.01); *H01L 23/00* (2013.01); *B82Y 30/00* (2013.01); *D01F 9/12* (2013.01); *Y10S 977/843* (2013.01)
USPC ..... 118/620; 423/447.3; 204/155; 204/157.4; 204/157.47; 977/843

(58) Field of Classification Search
USPC ........... 422/186.04; 423/447.1–447.3, 445 B; 977/742–754, 842–848; 118/620–643; 204/155, 157.15, 157.4, 157.47
See application file for complete search history.

(56) References Cited

U.S. PATENT DOCUMENTS 6,057,237 A * 5/2000 Ding et al. .................... 438/687
6,837,928 B1   1/2005 Zhang et al.

FOREIGN PATENT DOCUMENTS

| JP | 2004323871 | 11/2004 |
| JP | 2008075122 | 4/2008 |
| KR | 10-2007-0099912 | 10/2007 |

OTHER PUBLICATIONS

Machine translation of JP 2008-075122.*
Cinar Oncel, et al., "Carbon Nanotube Synthesis via the Catalytic CVD Method: A Review on the Effect of Reaction Parameters," Fullerenes, Nanotubes, and Carbon Nanostructures, 14: 2006, Copyright Taylor & Francis Group, LLC, pp. 17-37.

(Continued)

*Primary Examiner* — Daniel C McCracken

(57) ABSTRACT

A system for use in fabrication of carbon nanotubes (CNTs) includes a wafer having a circuitry and a plurality of CNT seed sites. The system also includes a base assembly configured to support the wafer. The system further includes a first tube disposed over the wafer and configured to surround the CNTs that form on the seed sites. The circuitry in the wafer is configured to conduct at least one static charge. The wafer includes a top surface having a plurality of CNT seed sites, each seed site coupled to the circuitry and configured to receive one of the at least one static charge.

20 Claims, 8 Drawing Sheets

(56) References Cited

OTHER PUBLICATIONS

Fusheng Xu, et al., "Synthesis of carbon nanotubes on metal alloy substrates with voltage bias in methane inverse diffusion flames," Available online at www.sciencedirect.com, Carbon 44 (2006) Elsevier, pp. 570-577.

Benjamin W. Yu, et al., "Atomic carbon vapor as a diamond growth precursor in thermal plasmas," J. Appl. Phys. 75 No. 8, 15, Apr. 1994, pp. 3914-3923.

R. Pflieger, et al., "Advances in the mass spectrometric study of the laser vaporization of graphite," Journal of Applied Physics 104, 054902, (2008), pp. 1-6.

M. Cantoro, et al., "Plasma restructuring of catalysts for chemical vapor deposition of carbon nanotubes," Journal of Applied Physics 105, 064304, (2009), pp. 1-10.

K.P. Ghatak, et al., "Thermoelectric power in carbon nanotubes and quantum wires of nonlinear optical, optoelectronic, and related materials under strong magnetic field: Simplified theory and relative comparision," Journal of Applied Physics 2008, pp. 1-21.

J. Sengupta, et al., "Carbon nanotube synthesis from propane decomposition on a pre-treated Ni overlayer," Bull. Mater. Sci., vol. 32, No. 2, Apr. 2009, pp. 135-140.

Alireza Nojeh, et al., "Electric-field-directed growth of carbon nanotubes in two dimensions," J. Vac. Sci. Technol. B 22(6), Nov./Dec. 2004, pp. 3421-3425.

W. Xiong, et al., "Self-aligned growth of single-walled carbon nanotubes using optical near-field effects," IOP Publishing, Nanotechnology 20, (2009), pp. 1-4.

Yuegang Zhang, et al., "Electric-field-directed growth of aligned single-walled carbon nanotubes," Applied Physics Letters, vol. 79, No. 19, Nov. 5, 2001, pp. 1-3.

\* cited by examiner

METHOD AND APPARATUS FOR FABRICATION OF CARBON NANOTUBES USING AN ELECTROSTATICALLY CHARGED SUBSTRATE AND LINER

TECHNICAL FIELD OF THE INVENTION

The present application relates generally to carbon nanotubes and, more specifically, to a method and apparatus for fabrication of carbon nanotubes using an electrostatically charged substrate and components.

BACKGROUND OF THE INVENTION

Carbon nanotubes (CNTs) have valuable qualities as structural materials. Potential uses can be found in fields as diverse as textiles, concrete, polyethylene, synthetic muscles, high tensile strength fibers, and fire protection. CNTs can be fabricated as electrical conductors, insulators, and semiconductors. A nanotube formed by joining two nanotubes of different diameters end to end can act as a diode, suggesting the possibility of constructing computer circuits entirely of nanotubes.

SUMMARY OF THE INVENTION

A fabrication process wafer for use in fabrication of carbon nanotubes is provided. The wafer includes a circuitry configured to conduct at least one static charge. The wafer also includes a top surface having a plurality of CNT seed sites, each seed site coupled to the circuitry and configured to receive one of the at least one static charge.

A system for use in fabrication of carbon nanotubes is also provided. The system includes a wafer having a circuitry and a plurality of CNT seed sites. The system also includes a base assembly configured to support and electrically connect to the wafer. The system further includes a first tube disposed over the wafer and configured to surround the CNTs that form on the seed sites.

A method for fabricating carbon nanotubes is also provided. The method includes placing a wafer on a base assembly, the wafer having a circuitry and a plurality of CNT seed sites. The method also includes placing a tube over the wafer. The method further includes forming a CNT at each seed site, the CNTs surrounded by the first tube.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

Figure 1:
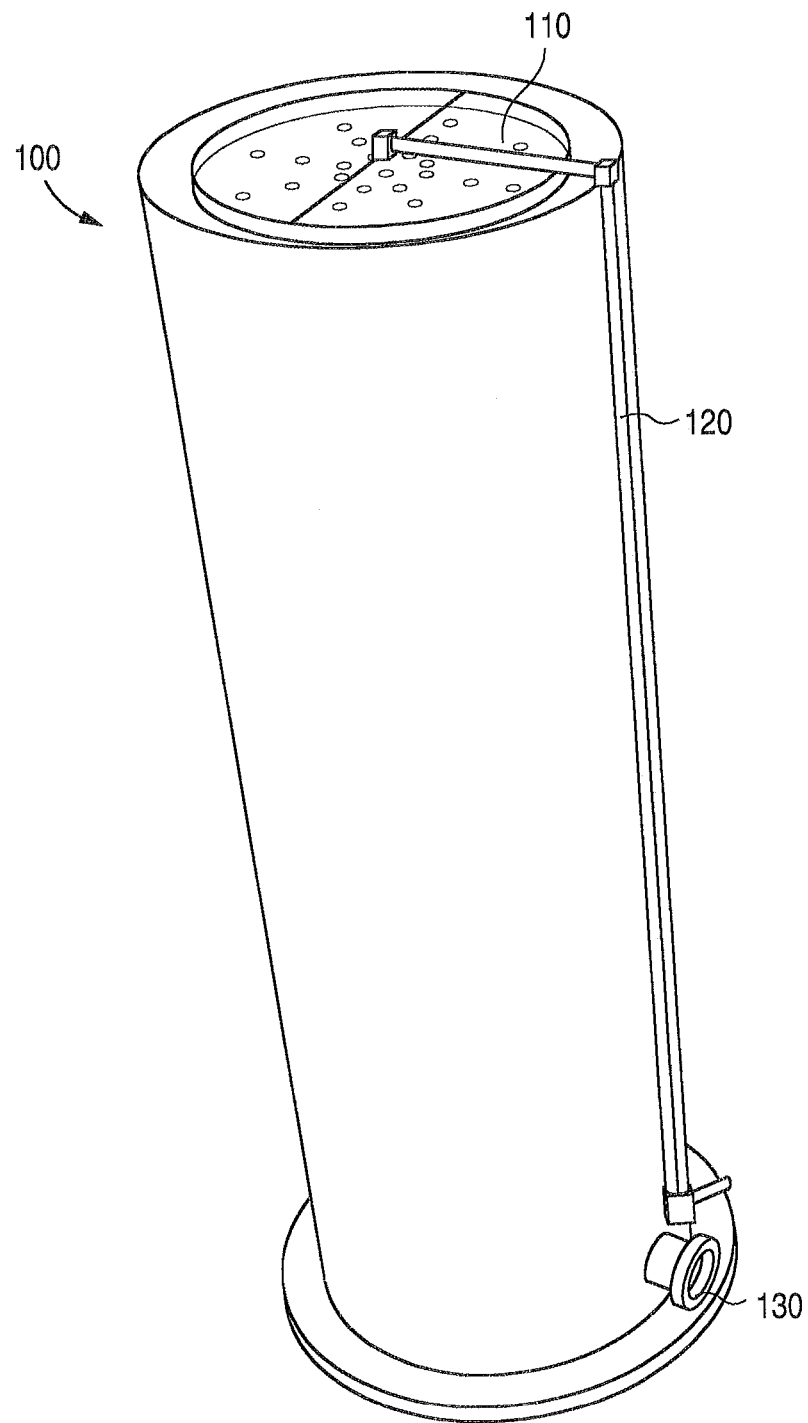
FIGS. 1 and 2 illustrate an outer tube for use in the fabrication of carbon nanotubes according to an embodiment of the present disclosure.

FIGS. 1 through 13, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged fabrication environment.

The invention will now be described with respect to various embodiments. The following description provides specific details for a thorough understanding of, and enabling description for, these embodiments of the invention. However, one skilled in the art will understand that the invention may be practiced without these details. In other instances, well known structures and functions have not been shown or described in detail to avoid unnecessarily obscuring the description of the embodiments of the invention.

In accordance with the present disclosure, methods and improvements in apparatuses used in the fabrication of vertically aligned, parallel carbon nanotubes is provided. The disclosed methods and apparatuses overcome current hurdles in growing carbon nanotubes to lengths greater than a few centimeters.

Previous solutions for fabricating CNTs include using radio frequency (RF) plasma and/or magnetic fields to hold the tubes in alignment. Previous methods involve generating fields external to the carbon nanotubes during growth, in contrast to the current invention, which uses the nanotubes as antennae to emit an electromagnetic field.

Some previous efforts have been unsuccessful due to difficulties in keeping the magnetic field uniform over the area of growth. Another drawback of some previous efforts is that the interactions between the carbon nanotubes and the magnetic fields have been relatively weak.

The methods and apparatuses of the present disclosure build upon current techniques to grow carbon nanotubes via chemical vapor deposition (CVD) and Plasma Enhanced CVD systems. Some embodiments include creating circuitry within the substrate to connect all CNTs electrically. Vertical linearity during growth is aided by a static charge applied to the CNTs and to a liner. The static charge may be applied equally or unequally to the CNTs and the liner. The static charges on each of the CNTs produce an electrostatic field that repels all of the other CNTs. The force generated by the electrostatic field pushes the CNTs apart.

In addition to the electrostatic fields emitted by the CNTs, other external fields may exert an electrostatic force in order to "contain" the CNTs. The sum or balance of the internal forces (created on the CNT) and external forces (created on the liner) acts to fix the CNTs into parallel growth trajectories and maintain those parallel trajectories throughout the growth process. This method can be used in what is commonly referred to as a chamber tool, or in a vertical furnace. The vertical furnace provides enough vertical space to grow CNTs up to a meter in length, such as described herein. In addition, with minor modifications, the same principles described herein could be used in a chamber tool that would allow for quicker and/or better aligned production of smaller CNTs.

Although some methods of CNT growth may use magnetic and electrical fields to align CNTs during growth, those methods differ from the methods of the present disclosure in that the prior methods do not use the CNTs as antennae to emit a static charge that is used to keep neighboring CNT's vertically aligned.

Embodiments of the present disclosure may produce CNTs that are significantly longer and straighter than those that have been created to date. The disclosed embodiments also have the potential to grow CNTs with uniform electrical properties. The applications for improved CNTs are many. CNTs that are long and/or straight are potentially very valuable.

Embodiments of apparatuses employed for fabricating the CNTs will now be described.

Figure 2:
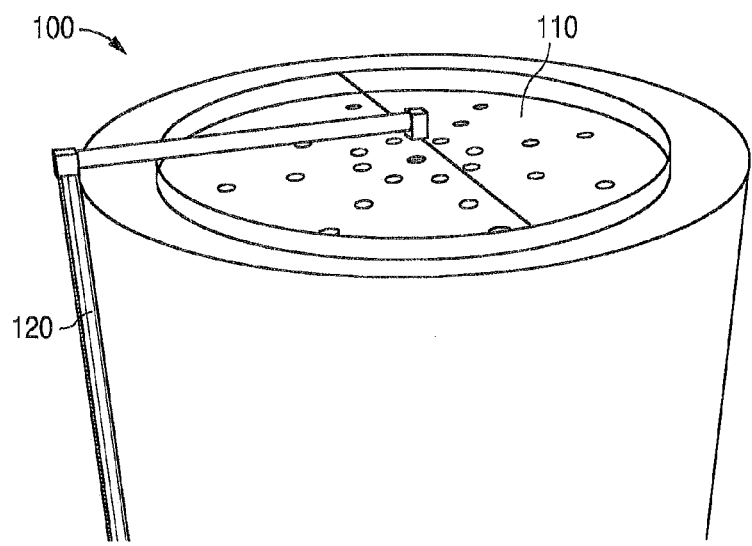

FIGS. 1 and 2 illustrate an outer tube for use in the fabrication of CNTs according to an embodiment of the present disclosure. FIG. 1 illustrates a perspective view of outer tube 100. FIG. 2 illustrates a close-up perspective view of an upper portion of outer tube 100.

Outer tube 100 makes up the sides and top of the process chamber. In some embodiments, outer tube 100 is similar to or the same as outer tubes that are used in some Kokusai® Pyro vertical furnaces. In one embodiment, outer tube 100 is approximately one meter in length, although outer tube 100 may have other lengths suitable for the generation of CNTs.

In some embodiments, the top of outer tube 100 includes a gas outlet 110, referred to as a "shower head". Shower head 110 includes a plurality of orifices or nozzles and is connected to tubing 120 that runs from the base of outer tube 100 up to shower head 110 at the top of outer tube 100. Tubing 120 serves as a via for process gasses. The process gasses flow through tubing 120 to shower head 110. The gasses then exit through the orifices of shower head 110 into the cavity of an inner tube used in CNT fabrication. In some embodiments, tubing 120 is formed of quartz, although other suitable materials may be used for tubing 120. In an embodiment, the diameter of shower head 110 may correspond to the diameter of the inner tube. In another embodiment, the diameter of shower head 110 is smaller than the diameter of the inner tube, such that the shower head 110 protrudes into the top opening of the inner tube. The inner tube is described in greater detail below.

Outer tube 100 also includes an exhaust port 130 that is disposed towards the bottom of outer tube 100. Exhaust port 130 provides an outlet for process gasses.

Figure 4:
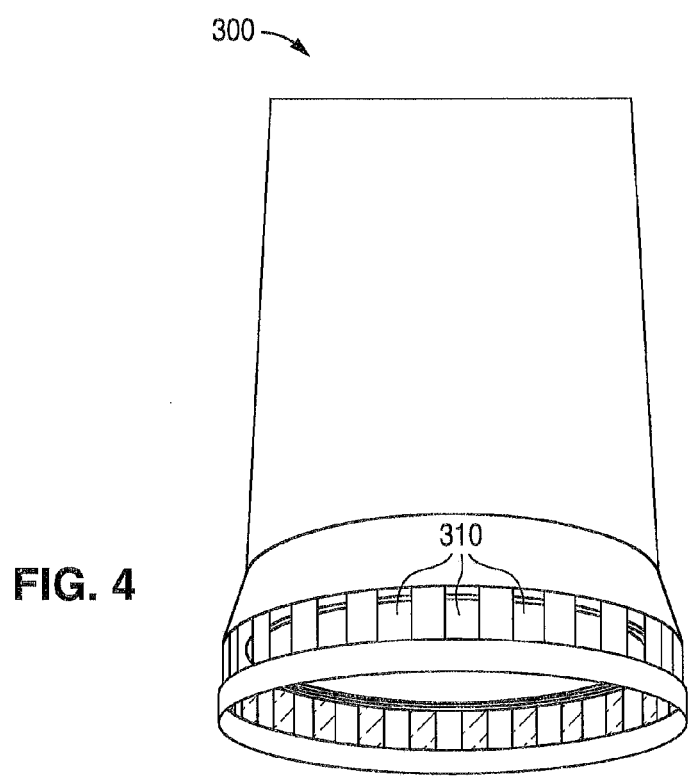
FIGS. 3 and 4 illustrate an inner tube for use in the fabrication of CNTs according to an embodiment of the present disclosure.
Figure 3:
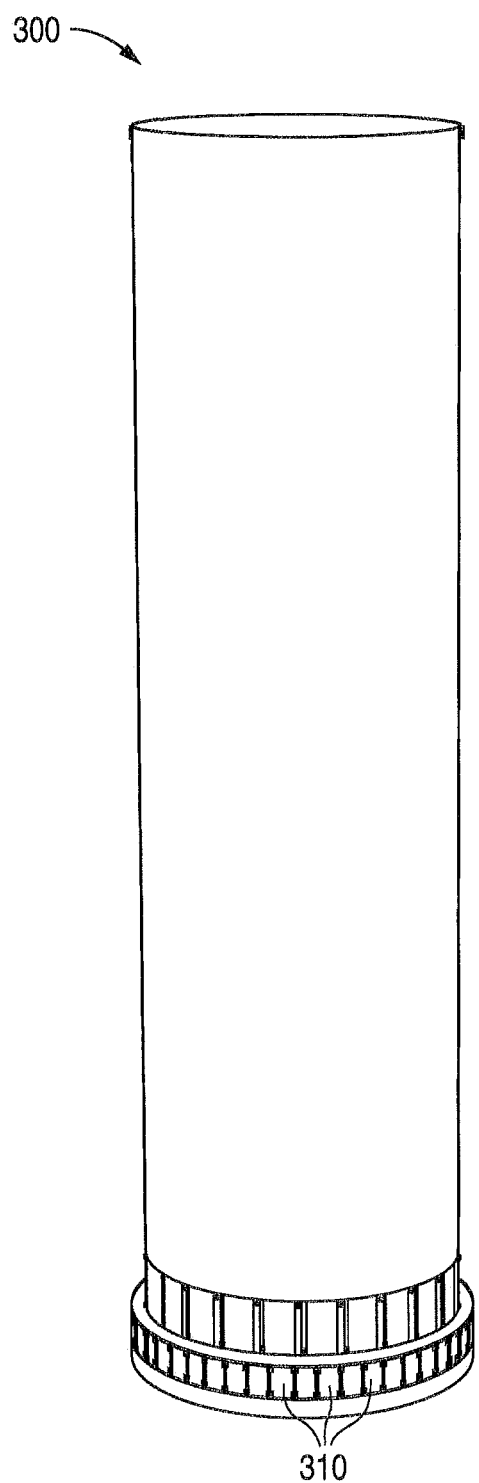

FIGS. 3 and 4 illustrate an inner tube for use in the fabrication of CNTs according to an embodiment of the present disclosure. FIG. 3 illustrates a perspective view of inner tube 300. FIG. 4 illustrates a close-up perspective view of a lower portion of inner tube 300. Embodiments of inner tube 300 may be used in conjunction with outer tube 100 of FIGS. 1 and 2, or in any other suitable system without departing from the scope of this disclosure. Inner tube 300 may also be referred to as a "liner". For ease of explanation, the term "inner tube" will be used hereinafter.

Inner tube 300 is hollow and open at the top and bottom. The bottom of inner tube 300 is flared slightly to accommodate a base fixture, which is described in greater detail below. The inner tube may be disposed atop the base fixture or be stationary and positioned inside the outer tube. Inner tube 300 includes a series of openings 310 around the perimeter of the flared bottom. This is different than typical inner tubes, which do not have similar openings at the bottom. The openings 310 allow a reversal of the direction of gas flow in the chamber. That is, openings 310 allow the process gasses to travel to the exhaust port 130 of the outer tube. In a typical inner tube, gas flows from bottom to top. In inner tube 300, gas flows from top to bottom. More specifically, inner tube 300 allows gasses to flow in from shower head 110, down through inner tube 300, make contact with a surface of the process wafer (described below), and then vent out of inner tube 300 through openings 310.

The inner surface of inner tube 300 includes a conductive film or coating. The conductive film is selected to withstand high heat conditions. In an embodiment, the conductive film may be formed of tungsten, although other suitable metals or conductive materials that have a suitably high melting point may be used. During processing, a static charge or electrical bias may be applied to various zones of the conductive film or to a single zone of the film, depending on how many zones of film are created on the surface of the inner tube. The static charge applied to the conductive film creates an electrostatic field that imposes a force on the carbon nanotubes, as described in greater detail below.

Although the conductive film is described as being on the inner surface of inner tube 300, it will be understood that the conductive film could additionally or alternatively be disposed on the outer surface of inner tube 300.

Figure 5:
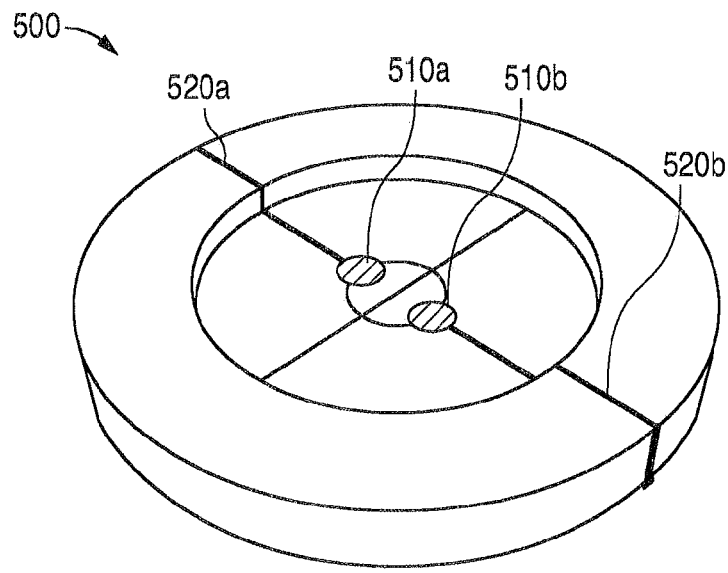
FIGS. 5 through 7 illustrate a base assembly for use in the fabrication of CNTs according to an embodiment of the present disclosure.
Figure 6:
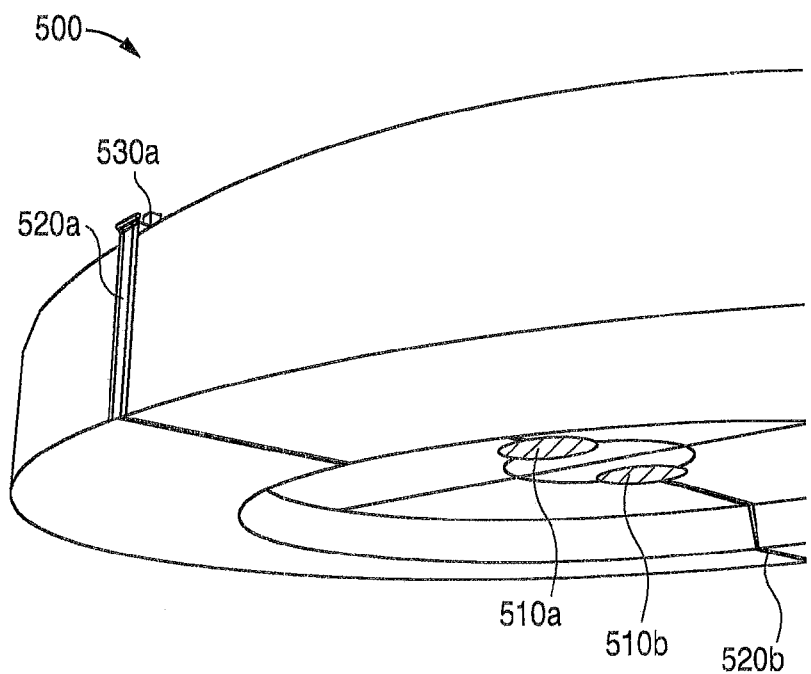
Figure 7:
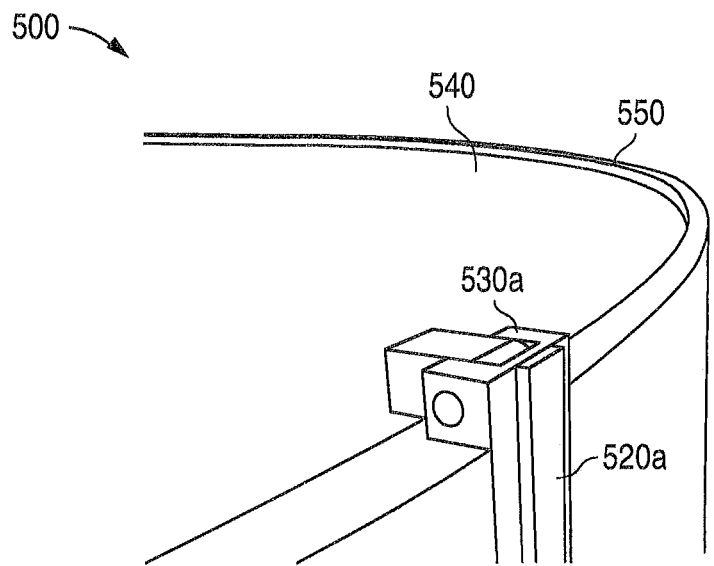

FIGS. 5 through 7 illustrate a base assembly for use in the fabrication of CNTs according to an embodiment of the present disclosure. FIG. 5 illustrates a perspective view of the underside of base assembly 500. FIG. 6 illustrates a close-up perspective view of the underside and edge of base assembly 500. FIG. 7 illustrates a close-up perspective view of a portion of the top side of base assembly 500. Embodiments of base assembly 500 may be used in conjunction with outer tube 100 and inner tube 300 of FIGS. 1 through 4, or in any other suitable system without departing from the scope of this disclosure.

In an embodiment, base assembly 500 is formed primarily of quartz. Conductive components comprise substantially the remainder of base assembly 500. In an embodiment, the conductive components are formed of tungsten or another suitable material. The conductive components serve to conduct a static charge to the process wafer and/or inner tube 300.

As shown in FIGS. 5 and 6, the bottom side of base assembly 500 includes two electrical contact patches 510a, 510b. The number, size, placement, and mechanism of electrical contact patches 510a, 510b is for illustration purposes only. Other arrangements of electrical contact patches or other means of electrical conduction may be used and will be apparent to those of skill in the art. Electrical contact patches 510a, 510b may connect base assembly 500 to electrical contacts on the rotate assembly (the rotate assembly is a standard device found in vertical furnaces). Conductive vias 520a, 520b connect electrical contact patches 510a, 510b to corresponding latches on the top side of base assembly 500. In the embodiment shown in FIGS. 5 and 6, conductive vias 520a, 520b extend from the electrical contact patches 510a, 510b to the edge of base assembly 500, then extend up the vertical side of base assembly 500 to the latches on the top side of base assembly 500.

Figure 8:
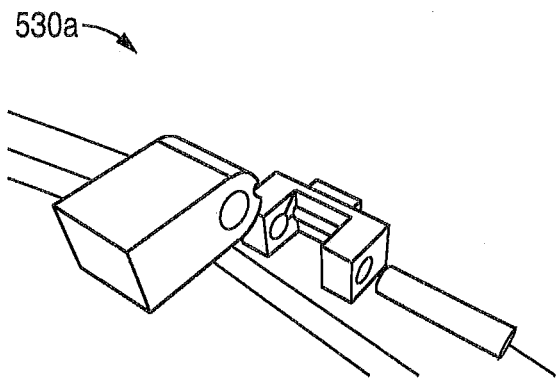
FIGS. 8 and 9 illustrate close-up exploded and assembled views, respectively, of a latch in a base assembly, according to an embodiment of the present disclosure.
Figure 9:
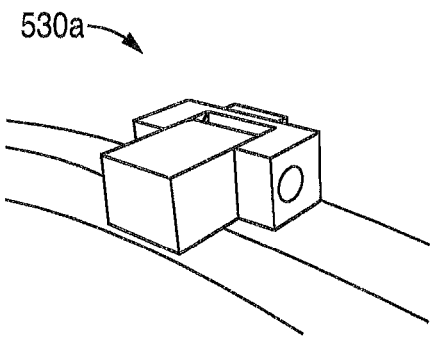

FIG. 7 illustrates a close-up view of one latch 530a on the top side of base assembly 500. Conductive via 520a extends up the vertical side of base assembly 500 to contact latch 530a. FIGS. 8 and 9 illustrate close-up exploded and assembled views, respectively, of latch 530a. A second latch (not shown) is located across the top side of base assembly 500 from latch 530a. The latch design shown in FIGS. 7 through 9 is for illustration purposes only and represents one embodiment of an electrical connection. The number, size, placement, and mechanism of latches may vary. Other arrangements of latches or electrical connections may be used and will be apparent to those of skill in the art.

As shown in FIG. 7, the top side of base assembly 500 includes a flat recess area 540 surrounded by a lip 550. Recess area 540 is configured to accept the process wafer and secure the wafer into position. In an embodiment, recess area 540 has a diameter of approximately 301 mm, which is just large enough to accept a 300 mm round wafer. Additionally or alternatively, base assembly 500 or recess area 540 may be configured to accommodate other sizes of wafers. The process wafer sits on base assembly 500 within recess area 540 during the CNT growth process.

After the process wafer is placed in recess area 540, the latches (including latch 530a) are closed over the edges of the wafer. The latches serve two purposes. First, the latches hold the process wafer in a fixed position during processing. Second, the latches serve as electrical contacts that transmit a static charge to the edge contacts of the process wafer.

Figure 10:
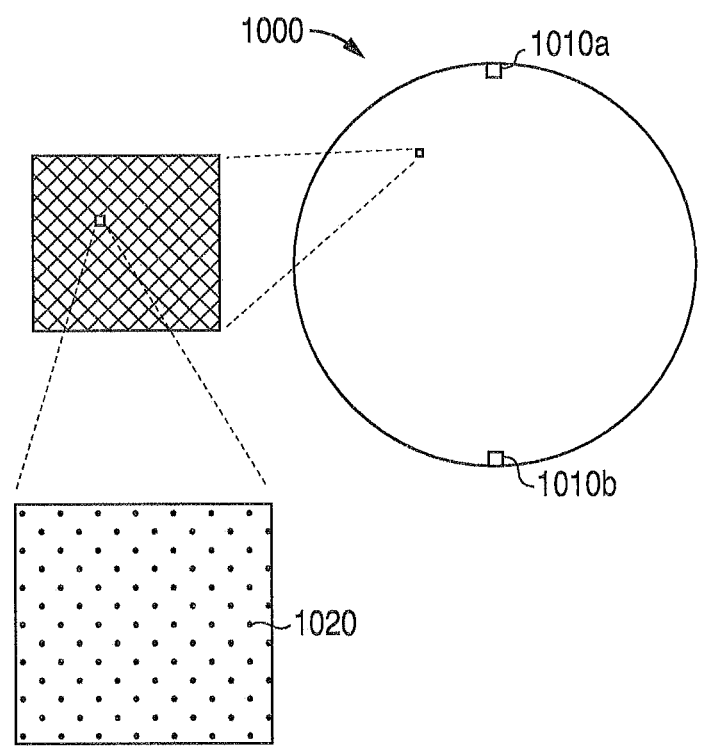
FIG. 10 illustrates a process wafer for use in the fabrication of CNTs according to an embodiment of the present disclosure.

FIG. 10 illustrates a process wafer for use in the fabrication of CNTs according to an embodiment of the present disclosure. Embodiments of process wafer 1000 may be used in conjunction with base assembly 500 of FIG. 5, or in any other suitable system without departing from the scope of this disclosure.

Process wafer 1000 is a flat, substantially round wafer. In an embodiment, process wafer 1000 is approximately 300 mm in diameter and is sized to just fit within recess area 540 of base assembly 500. Of course, other sizes of process wafer 1000 are possible. Process wafer 1000 includes circuitry embedded within the wafer. This is in contrast to typical CNT process wafers, which are smaller, square wafers than include no circuitry.

Process wafer 1000 includes exposed electrical contacts 1010a and 1010b at opposite sides of the periphery of wafer 1000. Electrical contacts 1010a, 1010b electrically connect wafer 1000 to the external static generator(s). The number, size, and placement of electrical contacts may vary. Other arrangements of electrical contacts may be used and will be apparent to those of skill in the art. In a specific embodiment, electrical contacts 1010a, 1010b are positioned to make contact with the latches of base assembly 500, including latch 530a.

The top surface of process wafer 1000 is a layer of $SiO_2$ or another suitable dielectric, within which a plurality of circuitry contacts are exposed. In one embodiment, several million circuitry contacts are exposed on the top surface of process wafer 1000. Each circuitry contact, represented by circuitry contact 1020 in the magnified portion of FIG. 10, is the top edge of a vertical post in the embedded circuitry, which is described in greater detail below.

Figure 11:
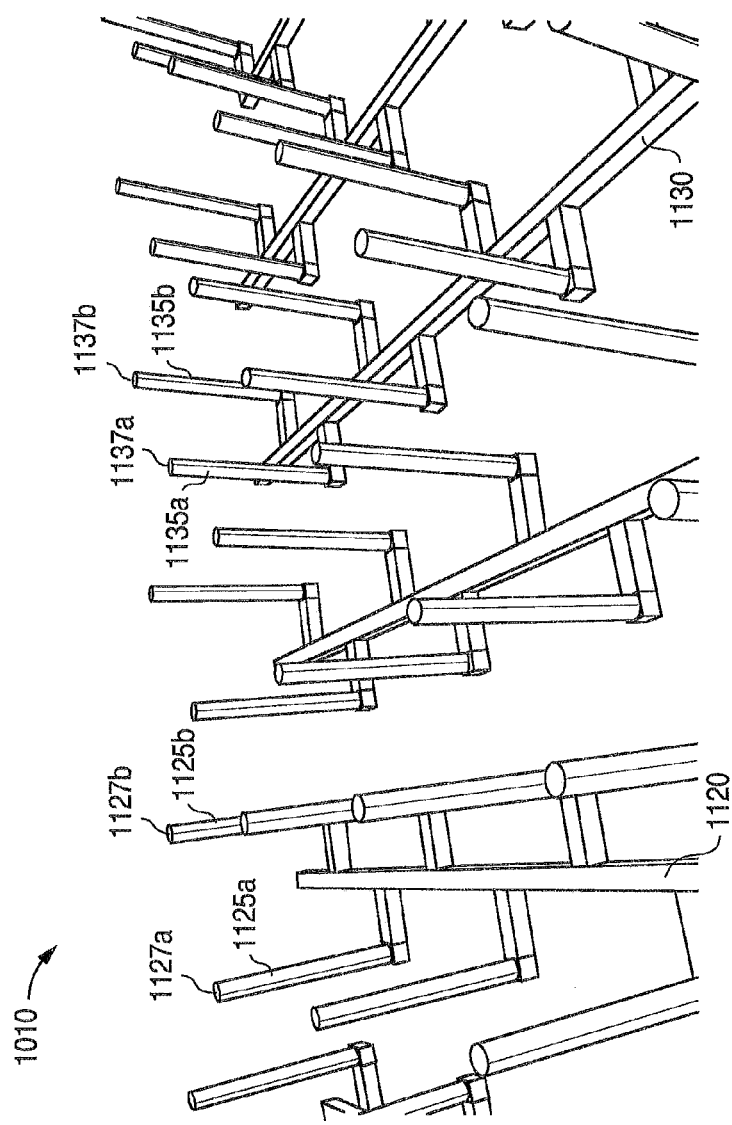
FIG. 11 illustrates a structure of a wafer circuitry embedded in a process wafer, according to an embodiment of the present disclosure.

FIG. 11 illustrates the structure of the wafer circuitry embedded in the process wafer 1000, according to an embodiment of the present disclosure.

Wafer circuitry 1100 comprises a plurality of horizontal conductive lines, represented in FIG. 11 by conductive lines 1120 and 1130, and a plurality of upright (or vertical) posts, represented in FIG. 11 by posts 1125a, 1125b, 1135a, and 1135b. Each horizontal conductive line is coupled to a distinct set of upright posts. For example, conductive line 1120 is coupled to upright posts 1125a, 1125b. Conductive line 1130 is coupled to upright posts 1135a, 1135b. Thus, different groups of upright posts may be controlled by controlling their associated conductive line.

Wafer circuitry 1100 is completely concealed in the upper layer of $SiO_2$ on process wafer 1000, except for the upper surface of each upright post, represented in FIG. 11 by upper surfaces 1127a, 1127b, 1137a, and 1137b. Each upper surface 1127a, 1127b, 1137a, and 1137b is exposed on the top surface of wafer circuitry 1100. Each upper surface 1127a, 1127b, 1137a, and 1137b is represented by one of the circuitry contacts (e.g., circuitry contact 1020) in FIG. 10. The upright posts are deposited within the upper layer of $SiO_2$. The conductive lines (e.g., conductive lines 1120, 1130) connect the upright posts (e.g., posts 1125a, 1125b, 1135a, 1135b) to the edge contacts 1010a, 1010b of process wafer 1000, which in turn, make electrical contact with base assembly 500.

The upright posts are formed of nickel, cobalt, a combination of the two, or another suitable material. The horizontal conductive lines are formed of tungsten or another suitable material, and are used to conduct a static charge to the vertical posts. The upper surface of each post (e.g., upper surface 1127a, 1127b, 1137a, and 1137b) is the seed site for each CNT. The seed site is exposed at the surface of wafer 1000 (e.g., circuitry contact 1020). The static charge transmitted to these sites is transmitted to the carbon nanotubes during the growth process.

The top of each post (i.e., seed site) is flush with the upper surface of process wafer 1000. In an embodiment, the layout of the seed sites is in a grid formation, such as shown in FIG. 10, with the seed sites evenly spaced. It will be understood that the seed sites may be arranged in other suitable layouts.

Figure 12:
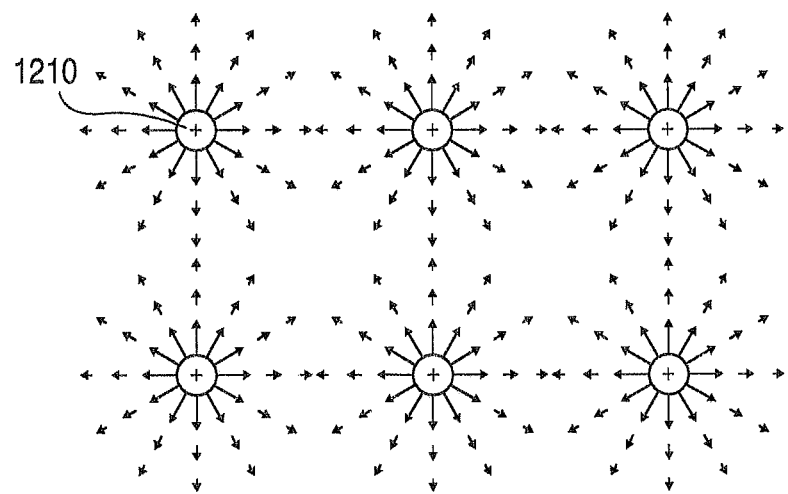
FIG. 12 illustrates a static charge field for use in the fabrication of CNTs according to an embodiment of the present disclosure.

FIG. 12 illustrates a static charge field for use in the fabrication of CNTs according to an embodiment of the present disclosure. As shown in FIG. 12, a plurality of seed sites, represented by seed site 1210, are disposed on a top surface of a process wafer. In an embodiment, the seed sites 1210 represent the circuitry contacts 1020 of process wafer 1000 in FIG. 10 and the upper surfaces 1127a, 1127b, 1137a, 1137b in FIG. 11.

A static charge applied to each seed site causes standing electromagnetic fields on each carbon nanotube, once the carbon nanotubes begin to grow. Each electromagnetic field exerts a repellant force away from each CNT. Repellant forces of adjacent CNTs tend to balance each other and cause the CNTs to grow substantially upward and parallel to each other. CNTs associated with seed sites on the edge of the wafer do not have adjacent CNTs on all sides. As a result, the CNTs at the edges of the wafer would have a tendency to grow "outward", i.e., lean away from the center of the wafer. To prevent the outward growth of edge CNTs, a static charge on the inner tube (i.e., inner tube 300) placed around the wafer also exerts a repellant force that "pushes" the edge CNTs toward the center of the wafer. The inward force from the inner tube balances the outward forces of adjacent seed sites, causing the edge CNTs to also grow substantially upward.

Figure 13:
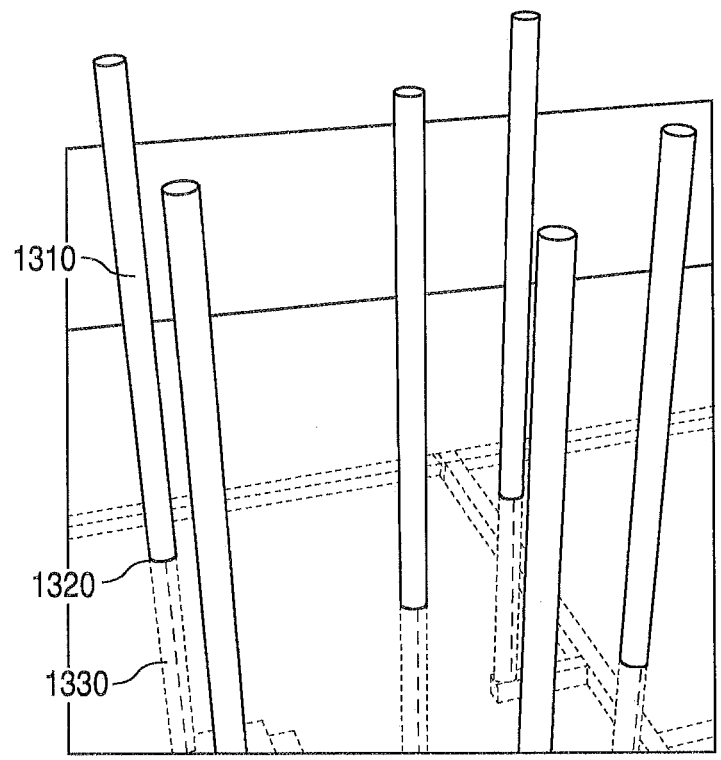
FIG. 13 illustrates a plurality of CNTs growing substantially vertically and parallel to each other, according to embodiments of the present disclosure.

FIG. 13 illustrates a plurality of CNTs growing substantially vertically and parallel to each other, according to embodiments of the present disclosure. Each CNT, represented by example CNT 1310, grows upward from a seed site, represented by example seed site 1320. Each seed site is a top edge of a vertical post, represented by example vertical post 1330, in circuitry embedded in a process wafer. The top edge of each vertical post is exposed on the top surface of the process wafer, such as described in FIGS. 10 and 11.

A process for the synthesis of carbon nanotubes in accordance with embodiments of the present disclosure will now be described.

First, a wafer is secured in a base assembly. The elevator, along with the wafer and base assembly, is raised to the process position, which is inside the inner tube. The inner tube may or may not be secured inside the outer tube which is secured inside the furnace. Once the elevator reaches the process position, an airtight seal is formed with the elevator and outer tube. The CNT processing chamber is then evacuated of gasses until a base pressure is reached. In one embodiment, the target base pressure is less than ten pascals (<10 Pa).

Next, the temperature in the processing chamber is raised from an arbitrary idle temperature to a processing temperature of 700° C.~1000° C. Nitrogen and ammonia gasses are introduced to the chamber while maintaining a less than atmospheric pressure.

The ammonia and nitrogen flow into the chamber for a variable length of time prior to the introduction of the carbon-carrying gas. Next, the carbon-carrying gas is introduced into the chamber. Carbon from the carbon-carrying gas deposits on the seed sites and forms CNTs. In one embodiment, the carbon-carrying gas is acetylene. The approximate ratio of acetylene to ammonia may be 7:3 according to common practices. A processing time may be determined through experimentation because the growth rate of the carbon nanotubes under the aforementioned conditions may change.

Next, static electricity is applied to the wafer by way of the base assembly. Static electricity is applied directly to the inner tube from an external generator, via the base assembly, or both. The voltage applied to the wafer is then transmitted to the seed sites on the wafer, which in turn is transmitted to the CNTs that grow on the wafer. If the voltage is applied to the inner tube, the inner tube acts to horizontally restrain the growth of the CNTs. In one embodiment, the circuitry within the process wafer is divided into zones. Thus, the wafer may be divided into separate zones, each zone having a different electrical contact and electrostatic field. The inner tube may also be divided into zones, each zone having a separate electrical contact. During processing, the voltage in each zone could be controlled to affect how straight the CNTs are growing. Trajectory and length may be varied for different applications.

Once the carbon nanotubes reach a desired length, the static charges are removed, the flow of ammonia and acetylene is stopped, and the chamber is brought back to atmospheric pressure by back filling the chamber with nitrogen. The temperature is reduced to the idle temperature. The elevator is then lowered so that the base assembly, processing wafer, carbon nanotubes, and the liner (if the liner rest atop the elevator) can be removed.

Embodiments of the present disclosure may produce CNTs that are significantly longer and straighter than those that have been created to date. For example, using the methods and apparatuses of the present disclosure, it may be possible to produce CNTs having lengths greater than one meter. This is a substantial improvement over prior art techniques that result in CNTs having lengths of approximately 12-18 cm.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A system for use in fabrication of carbon nanotubes (CNTs), the system comprising:
   a wafer having a circuitry and a plurality of CNT seed sites;
   a base assembly configured to support and electrically connect to the wafer; and
   a first tube disposed over the wafer and configured to surround the CNTs that form on the seed sites, the first tube comprising a conductive coating configured to generate an electrostatic field inside the first tube.

2. The system of claim 1, wherein the circuitry in the wafer conducts a static charge at each seed site.

3. The system of claim 1, wherein the electrostatic field generated inside the first tube exerts a force directed radially inward on the CNTs that form on the seed sites.

4. The system of claim 1, further comprising a second tube configured to surround the first tube.

5. The system of claim 4, wherein the second tube comprises a shower head having a plurality of orifices configured to transmit process gasses into the first tube.

6. The system of claim 5, wherein the first tube comprises a plurality of openings around the perimeter of a bottom portion, the openings configured to allow the process gasses to vent out of the first tube.

7. The system of claim 1, wherein the base assembly comprises at least one electrical contact configured to transmit a static charge to the wafer.

8. The system of claim 7, wherein the at least one electrical contact of the base assembly comprises a latch configured to transmit the static charge to an electrical contact of the wafer, the latch further configured to secure the wafer to the base assembly.

9. The system of claim 1, wherein the base assembly transmits a static charge to the first tube.

10. A method for fabricating carbon nanotubes (CNTs), the method comprising:
    placing a wafer on a base assembly, the wafer having a circuitry and a plurality of CNT seed sites, the base assembly configured to support and electrically connect to the wafer;
    placing a first tube over the wafer, the first tube comprising a conductive coating;
    generating, by the conductive coating, an electrostatic field inside the first tube; and
    forming a CNT at each seed site, the CNTs surrounded by the first tube.

11. The method of claim 10, further comprising:
    generating, by the circuitry in the wafer, a static charge at each seed site.

12. The method of claim 10, wherein the electrostatic field generated inside the first tube exerts a force directed radially inward on the CNTs that form on the seed sites.

13. The method of claim 10, wherein the base assembly comprises at least one electrical contact configured to transmit a static charge to the wafer.

14. The method of claim 10, wherein the base assembly transmits a static charge to the first tube.

15. A system for use in fabrication of carbon nanotubes (CNTs), the system comprising:
- a wafer having a circuitry and a plurality of CNT seed sites;
- a base assembly configured to support and electrically connect to the wafer; and
- a first tube disposed over the wafer and configured to surround the CNTs that form on the seed sites, the first tube comprising a conductive coating configured to generate an electrostatic field inside the first tube;
- a second tube configured to surround the first tube, the second tube comprising a shower head having a plurality of orifices configured to transmit process gasses into the first tube and an exhaust port configured to provide an outlet for gasses.

16. The system of claim 1, wherein the circuitry in the wafer conducts a static charge at each seed site.

17. The system of claim 1, wherein the electrostatic field generated inside the first tube exerts a force directed radially inward on the CNTs that form on the seed sites.

18. The system of claim 5, wherein the first tube comprises a plurality of openings around the perimeter of a bottom portion, the openings configured to allow the process gasses to vent out of the first tube.

19. The system of claim 1, wherein the base assembly comprises at least one electrical contact configured to transmit a static charge to the wafer.

20. The system of claim 7, wherein the at least one electrical contact of the base assembly comprises a latch configured to transmit the static charge to an electrical contact of the wafer, the latch further configured to secure the wafer to the base assembly.

* * * * *